(12) United States Patent
Greeley et al.

(10) Patent No.: US 8,513,135 B2
(45) Date of Patent: Aug. 20, 2013

(54) METHODS OF MODIFYING OXIDE SPACERS

(75) Inventors: Joseph Neil Greeley, Boise, ID (US); Paul Morgan, Kuna, ID (US); Mark Kiehlbauch, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/246,050

(22) Filed: Sep. 27, 2011

(65) Prior Publication Data
US 2012/0015520 A1 Jan. 19, 2012

Related U.S. Application Data

(63) Continuation of application No. 11/777,005, filed on Jul. 12, 2007, now Pat. No. 8,026,180.

(51) Int. Cl.
*H01L 21/302* (2006.01)

(52) U.S. Cl.
USPC ............... 438/710; 438/9; 438/14; 438/725; 257/E21.25

(58) Field of Classification Search
USPC 438/696, 9, 14, 710, 717, 725; 257/E21.521
See application file for complete search history.

(56) References Cited

U.S. PATENT DOCUMENTS

| | | | |
|---|---|---|---|
| 6,821,713 B1 | 11/2004 | Holbrook et al. | |
| 6,838,347 B1 * | 1/2005 | Liu et al. | 438/291 |
| 6,949,460 B2 | 9/2005 | Wagganer et al. | |
| 7,087,532 B2 * | 8/2006 | Dobuzinsky et al. | 438/717 |
| 7,115,525 B2 | 10/2006 | Abatchev et al. | |
| 7,135,419 B2 | 11/2006 | Chandhok et al. | |
| 7,151,040 B2 | 12/2006 | Tran et al. | |
| 7,253,118 B2 | 8/2007 | Tran et al. | |
| 7,431,966 B2 | 10/2008 | Derderian et al. | |
| 7,462,243 B2 | 12/2008 | Laflamme, Jr. et al. | |
| 7,510,972 B2 | 3/2009 | Nishimura et al. | |
| 7,563,723 B2 | 7/2009 | Abatchev et al. | |
| 7,651,951 B2 | 1/2010 | Tran et al. | |
| 7,718,540 B2 * | 5/2010 | Tran et al. | 438/717 |
| 7,786,016 B2 * | 8/2010 | Sinha et al. | 438/705 |
| 2005/0218114 A1 | 10/2005 | Yue et al. | |
| 2006/0008669 A1 | 1/2006 | Chan | |

(Continued)

FOREIGN PATENT DOCUMENTS

| | | |
|---|---|---|
| JP | 06-224153 | 8/1994 |
| JP | 2005-085878 | 3/2005 |

(Continued)

OTHER PUBLICATIONS

Semiconductor Production Equipment, Etch Systems, Tokyo Electron, http://www.tel.com/eng/product/es/bues.htm, printed Jul. 13, 2007.
Tokyo Electric Etch Systems, http://www.tel.com/eng/product/guide/es.sub.—e.pdf, printed Jul. 13, 2007.

(Continued)

*Primary Examiner* — Nadine Norton
*Assistant Examiner* — Maki Angadi
(74) *Attorney, Agent, or Firm* — TraskBritt

(57) ABSTRACT

Methods for reducing line roughness of spacers and other features utilizing a non-plasma and non-wet etch fluoride processing technology are provided. Embodiments of the methods can be used for spacer or line reduction and/or smoothing the surfaces along the edges of such features through the reaction and subsequent removal of material.

20 Claims, 3 Drawing Sheets

(56) References Cited

U.S. PATENT DOCUMENTS

| | | |
|---|---|---|
| 2006/0060562 A1 | 3/2006 | Furukawa et al. |
| 2006/0196527 A1 | 9/2006 | Nishimura et al. |
| 2006/0219660 A1 | 10/2006 | Nishimura et al. |
| 2007/0010906 A1 | 1/2007 | Abe |
| 2007/0138526 A1 | 6/2007 | Tran et al. |
| 2008/0008969 A1 | 1/2008 | Zhou et al. |
| 2008/0311688 A1 | 12/2008 | Yamashita et al. |

FOREIGN PATENT DOCUMENTS

| | | |
|---|---|---|
| JP | 2006-173288 | 6/2006 |
| WO | 2005062344 | 7/2005 |
| WO | 2006101695 | 9/2006 |

OTHER PUBLICATIONS

Tokyo Electron, Semiconductor Production Equipment, Tactras, http://www.tel.com/eng/product/es/estactras.htm, printed Jul. 13, 2007.

Tokyo Electron, Semiconductor Production Equipment, Telius, http://www.tel.com/eng/product/es/estelius.htm, printed Jul. 13, 2007.

Tokyo Electron, Semiconductor Production Equipment, UNITY LS, http://www.tel.com/eng/product/es/esunityls.htm, printed Jul. 13, 2007.

Tokyo Electron, Semiconductor Production Equipment, UNITY Me, http://www.tel.com/eng/product/es/esunity.htm, printed Jul. 13, 2007.

* cited by examiner

METHODS OF MODIFYING OXIDE SPACERS

CROSS-REFERENCE TO RELATED APPLICATION

This application is a continuation of U.S. patent application Ser. No. 11/777,005, filed Jul. 12, 2007, now U.S. Pat. No. 8,026,180, issued Sep. 27, 2011.

TECHNICAL FIELD

Embodiments of the invention relate to methods of reducing line roughness of spacers and line features.

BACKGROUND OF THE INVENTION

There is a continuing trend toward decreasing feature sizes and dimensions at submicron levels in fabricating semiconductor devices. The narrow widths/diameters and close spacing of features such as interconnecting lines and contact openings requires small features sizes produced by high-resolution photolithography. When defining lines with small widths or critical dimensions (CD) and close pitch distances, variations that occur in patterning such features become problematic due to the small size and closeness of features. One such variation is known as "line edge roughness" (LER), which is a horizontal deviation or measurement of unwanted edges and bumps on a boundary such as a line edge or sidewall of a patterned feature, making it appear ragged rather than smooth. In addition, a line is ideally straight such that the width is approximately identical for the entire length of the feature (e.g., a critical dimension 25 nm wide line). "Line width roughness" (LWR) is a deviation in the width or CD of a line feature due to a variation in peak-to-valley amplitude of a non-uniform line edge along its length.

Line defects such as LWR and LER occurring in patterned features can be caused, for example, by a corresponding defect within an overlying photoresist or hard mask pattern that is transferred into an underlying material layer or film during a subsequent etch. Line defects introduced during patterning becomes more pronounced as device features continue to shrink in size, impacting process control by causing variations in channel and line dimensions beyond accepted limits and/or improper overlay or placement control of features, which presents a significant adverse effect on device performance and function including problems of leakage and short channel effect control. For example, lines that have a width of 70 nm or less, a peak-to-valley LWR of 3 nm or more can alter the subsequently patterned feature beyond acceptable tolerances.

Attempts have been made to reduce line defects on oxide-based mask lines by eliminating undesirable curves and protrusions such as whiskers. Treatments involving a wet etch, such as an HF wet chemistry, etch oxide features isotropically (i.e., equally in vertical and horizontal directions) resulting in an overall trimming (thinning) of the feature without eliminating unwanted curves or straightening the lines. Other treatments that involve depositing material (e.g., polymer) to smooth out a line feature followed by a plasma etch back to resize the feature, also reduce the vertical height or thickness of the line, which is undesirable in a mask structure.

It would be useful to provide a method for eliminating line roughness defects in features that overcome these or other problems.

BRIEF DESCRIPTION OF THE DRAWINGS

Embodiments of the invention are described below with reference to the following accompanying drawings, which are for illustrative purposes only. Throughout the following views, reference numerals will be used in the drawings, and the same reference numerals will be used throughout the several views and in the description to indicate same or like parts.

DETAILED DESCRIPTION OF THE INVENTION

The following description with reference to the drawings provides illustrative examples of devices and methods according to embodiments of the invention. Such description is for illustrative purposes only and not for purposes of limiting the same.

In the context of the current application, the terms "semiconductor substrate," "semiconductive substrate," "semiconductive wafer fragment," "wafer fragment," or "wafer" will be understood to mean any construction comprising semiconductor material including, but not limited to, bulk semiconductive materials such as a semiconductor wafer (either alone or in assemblies comprising other materials thereon), and semiconductive material layers (either alone or in assemblies comprising other materials). The term "substrate" refers to any supporting structure including, but not limited to, semiconductive substrates, wafer fragments or wafers described above.

In embodiments of the invention, the method can be implemented to reduce line edge roughness (LER) and smooth surfaces of features such as linear openings in an oxide material layer, as illustrated in FIGS. 1-3B.

Figure 1:
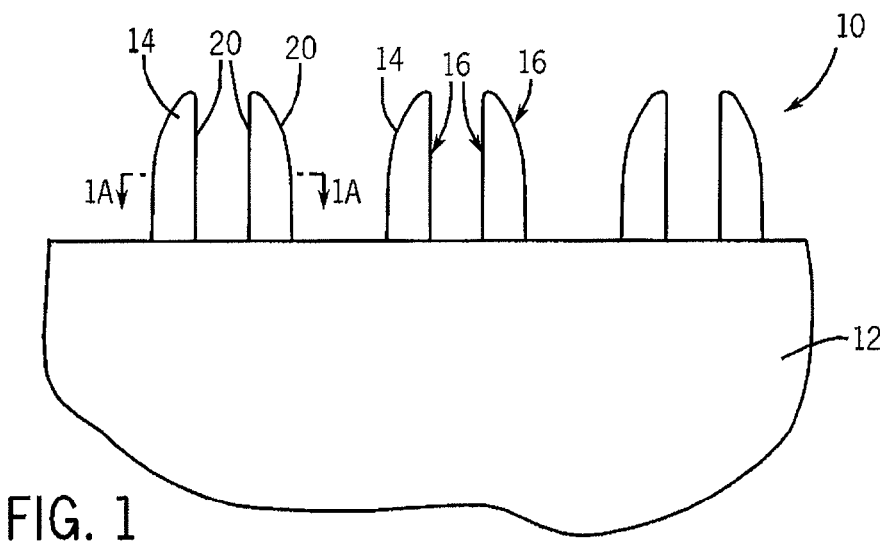
FIG. 1 illustrates an elevational, cross-sectional view of a portion of a substrate at a preliminary processing stage according to an embodiment of the present disclosure, showing oxide spaces formed on the substrate.

FIG. 1 illustrates a substrate 10 (e.g., wafer) having a hard mask composed of a pattern of free-standing lines or spacers 14 extending in a spaced, generally parallel relation to one another, to transfer a pattern of linear openings into an underlying material layer 12, which can be, for example, a dielectric antireflective coating (DARC, silicon-rich silicon oxynitride), amorphous carbon, silicon nitride, polysilicon, crystalline silicon, a metal layer, among others. The spacers 14 (e.g., hardmask) include a silicon oxide component, e.g., $SiO_x$, ALD $SiO_x$, tetraethylorthosilicate (TEOS) oxide, DARC (silicon-rich silicon oxynitride), and the like, being silicon oxide ($SiO_x$) in the described embodiments.

The spacers 14 can be formed according to known methods. For example, the spacers 14 can be formed by depositing a blanket layer of a spacer material on sidewalls 20 of a patterned temporary layer (e.g., photoresist, amorphous carbon, etc.) and removing spacer material from horizontal surfaces (e.g., by an anisotropic etch using fluorocarbon plasma) followed by removal of the temporary layer (e.g., using an organic strip process such as $O_2$) to leave vertically extending, free-standing spacers 14. The blanket layer of the spacer material can be deposited, for example, by atomic layer deposition, by chemical vapor deposition (e.g., using $O_3$ and TEOS as precursors), etc. See, for example, U.S. Patent Publication No. 2006/0211260 (Tran et al.), now U.S. Pat. No. 7,253,118, issued Aug. 7, 2007, the disclosure of which is incorporated by reference herein. The spacers 14 are formed to have a desired width or critical dimension (CD), for example, about 25-50 nm, and in some embodiments, about 10-20 nm. Because spacers 14 are formed on the sidewalls 20 of the patterned photoresist, the conformal nature of an ALD oxide deposition process results in a transfer of the LWR that is present in a patterned photoresist to the oxide spacers 14.

Figure 1A:
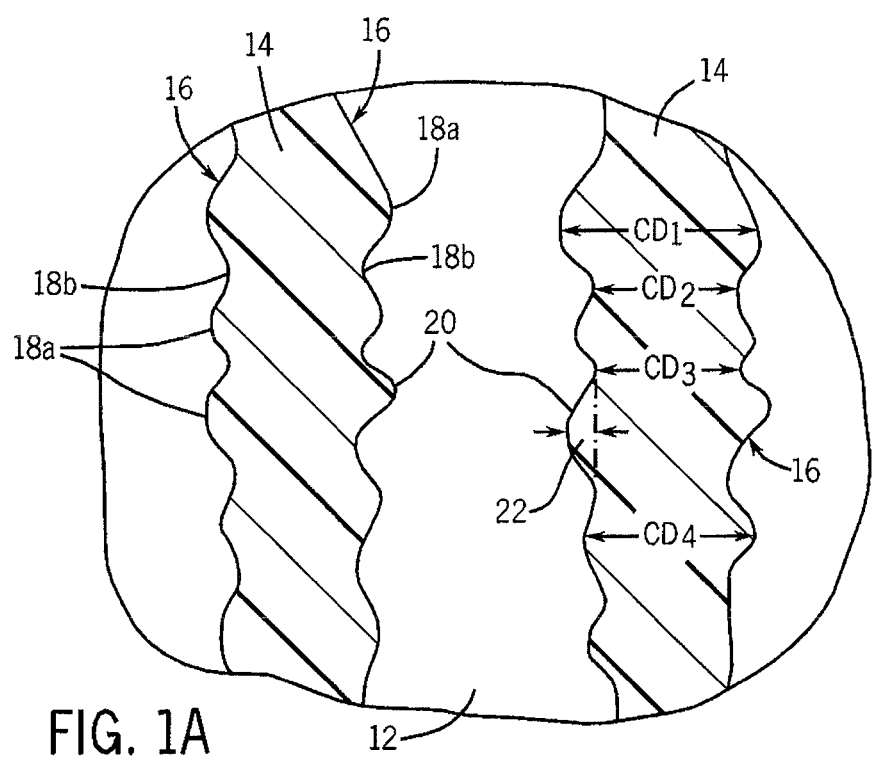
FIG. 1A is a diagrammatic top plan view of the substrate depicted in FIG. 1 taken along lines 1A-1A, showing a lengthwise section of a pair of spacers displaying line width roughness (LWR).

As shown in FIG. 1A, the oxide spacers 14 exhibit a "line width roughness" (LWR) or deviation of critical dimension (width), denoted as $CD_{1-4}$, along the length of the spacer 14 due to a profile of the edge 16 that is non-uniform and wavy with peaks 18a (convex or elevated surface features) and valleys 18b (concave or recessed surface features) along the vertical surfaces or sidewalls 20 and a variable peak-to-valley (or convex-to-concave) LWR amplitude 22.

In embodiments of the invention, methods utilizing a fluoride processing technology that is between a vapor etch and a wet etch, are applied to reduce line width roughness (LWR) of the line edges 16 of oxide spacers 14 by reducing or eliminating peaks 18a along the edges 16 having a peak-to-valley LWR amplitude (or thickness) of about 5 nm or less, or about 0.1-5 nm, or up to about 2 nm). Embodiments of the invention achieve spacer (line) reduction and/or smoothing of vertical and horizontal surfaces of spacers through the reaction and subsequent removal of material along the edges 16 and sidewalls 20 of the spacers 14.

Figure 2A:
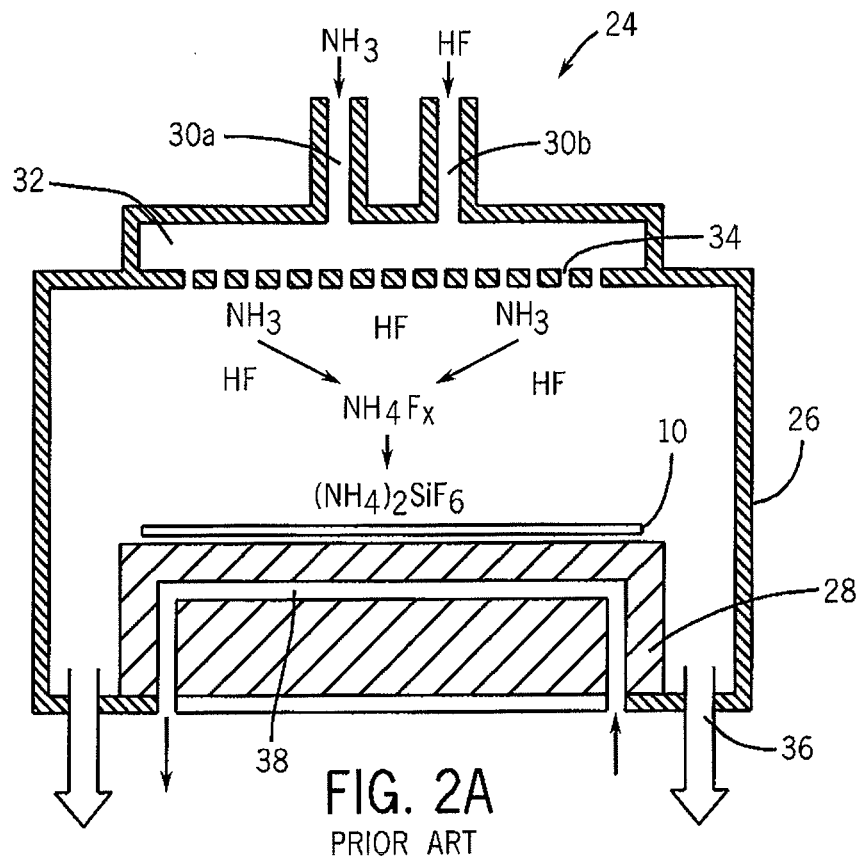
FIGS. 2A and 2B are elevational, cross-sectional views of a prior art processing system including an apparatus for performing a chemical oxide removal (COR) process (FIG. 2A) and an apparatus for performing a post-heat treatment (PHT) process (FIG. 2B) according to embodiments of the present disclosure.
Figure 2B:
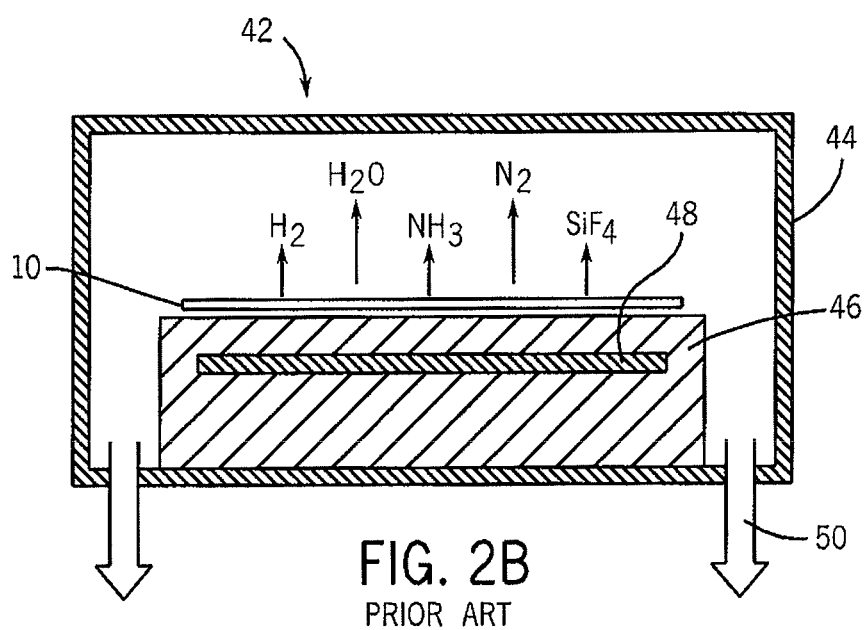

The oxide spacers 14 are processed in a first step by performing a chemical oxide removal (COR) process, followed by a treatment such as a post-heat treatment (PHT) process to remove the reaction byproduct material that is formed. FIGS. 2A and 2B illustrate a prior art system for performing a COR treatment and a PHT treatment. Such systems are described, for example, in U.S. Patent Publication No. 2006/0219660, now U.S. Pat. No. 7,402,523, issued Jul. 22, 2008, U.S. Patent Publication No. 2006/0196527 (Nishimura et al.), abandoned, U.S. Patent Publication No. 2005/0218114 (Yue et al.), abandoned, and U.S. Patent Publication No. 2007/0010906 (Abe) (Tokyo Electron Limited (TEL), Japan), abandoned, the disclosures of which are incorporated by reference herein.

The substrate 10 bearing the oxide spacers 14 can be placed into a first processing system 24 as shown in FIG. 2A, for performing a chemical oxide removal (COR) treatment, which is a dry etch process in which no plasma is generated from the processing gas. In embodiments of a COR process according to the invention, oxide spacers 14 are exposed to ammonium fluoride chemistry for a fixed time period at a controlled temperature and partial pressure of the reaction gases to chemically react with and convert a portion of the oxide spacer material 14 to a heat decomposable material (e.g., $(NH_4)_2SiF_6$). The method can be implemented to achieve controlled removal of small-scale topography from a defined feature (versus trimming of an oxide layer in bulk), for example, to reduce or eliminate the peaks 18a of spacers 14 to reshape and straighten the profile of the edges 16.

As illustrated, the COR processing system 24 can include a vacuum processing chamber 26, a mounting table 28 with a support (e.g., wafer chuck) for the substrate 10, gas supply lines 30a, 30b for the processing gases, a gas dispenser 32 (e.g., a showerhead) with a heating element (not shown) to control the temperature of the gases and multiple openings 34 for introducing the processing gases into the processing chamber 26, a gas discharge port 36, and a cooling channel 38 for circulating a coolant to maintain the substrate 10 at a desired temperature.

In embodiments of the method, the processing gases are a gas mixture of ammonia ($NH_3$) gas and hydrogen fluoride (HF) gas, optionally with an inert carrier gas such as argon (Ar). When carrying out the COR processing, the $NH_3$ gas and HF gas are supplied into separate buffer chambers and diffused though the openings 34 into the processing chamber 26 (FIG. 2A). The chamber 26 can be heated to a temperature to provide a wall surface temperature of about 25°C.-80° C. to prevent attachment of by-products on the chamber walls.

Figure 3A:
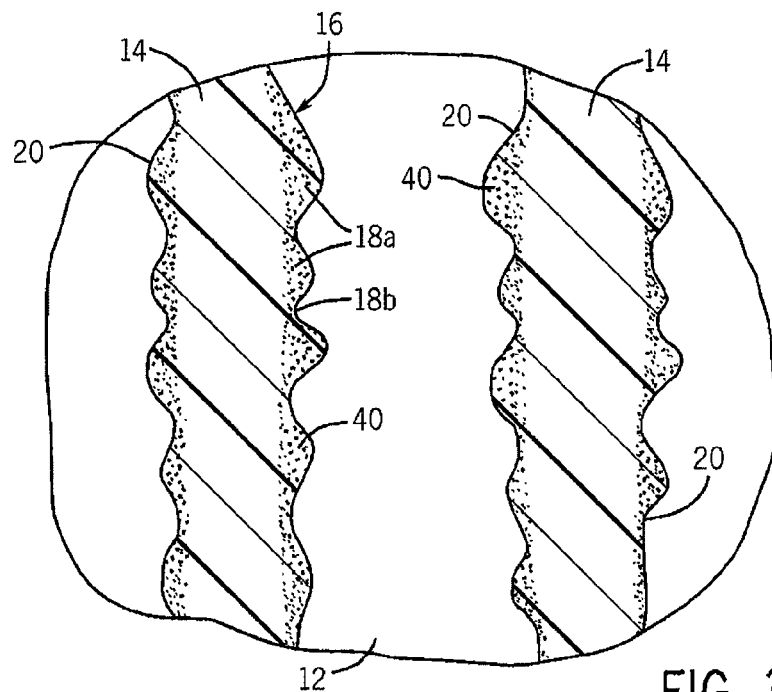
FIGS. 3A and 3B are top plan views of the spacers depicted in FIG. 1A at subsequent processing stages according to embodiments of the disclosure.

As depicted in FIG. 3A, the $NH_3$/HF gas mixture reacts with the oxide spacers 14 to convert portions of the oxide material along the sidewalls 20 (and top surface) into a layer 40 of ammonium hexafluorosilicate (($NH_4)_2SiF_6$), a heat decomposable compound. Application of the gas mixture results in the diffusion of ammonium-based radicals or species ($NH_4F$ radicals) through the previously formed $(NH_4)_2SiF_6$ layers to the underlying oxide material, wherein additional thickness(es) of the oxide layer are etched and converted to $(NH_4)_2SiF_6$. Unlike other fluorine-based strategies, the etch mechanism is driven by diffusion into the oxide material, thus making it diffusion limited (self-limiting) and controllable. The thickening $(NH_4)_2SiF_6$ layer 40 functions as a diffusion barrier to gradually block and reduce diffusion of the ammonium species, slowing the rate of reaction and eventually bringing the process to an end. The gases are then pumped out of the processing chamber 26 (FIG. 2A).

Because the COR process is diffusion limited, there is generally faster (and greater) etching of more exposed convex areas (peaks) 18a than less exposed concave areas (valleys) 18b along the sidewalls 20 (edges 16) of the oxide spacers 14 compared to a planar surface, resulting in a greater thickness of byproduct layer 40 formed in the peaks 18a over a fixed time period. The higher or accelerated etch rate of higher surface areas ("peaks") than "valleys" results in effective removal of convex or protruding oxide material (peaks 18a) including "whiskers" along the sidewalls 20 (edges 16) of the spacers 14.

The COR processing can be performed for a set amount of time to chemically convert (etch) all or a portion of the peaks 18a and/or other features on the surface and along the edges 16 and sidewalls 20 of the spacers 14 and the processing can be terminated. The substrate 10 can then be transferred into a PHT heating chamber where the reaction byproduct $((NH_4)_2SiF_6)$ layer 40 is processed and desorbed. The surface features on the edges 16 and sidewalls 20 of the openings can be examined, for example, using atomic force microscopy (AFM), transmission electron microscopy (TEM), and scanning electron microscopy (SEM).

The amount of oxide material (e.g., peaks 18a) that is converted during COR processing can be controlled, for example, by varying the gas flow rates of the reaction gases (e.g., $NH_3$, HF), the gas pressure in the processing chamber 26 (FIG. 2A), the substrate temperature, and/or the processing time of the COR reaction.

For example, in embodiments according to the invention, the COR process can be conducted to cause a reaction and conversion of features (e.g., peaks 18a) having a thickness or amplitude 22 of about 5 nm or less, e.g., about 0.1-5 nm, or up to about 2 or 3 nm, under process conditions that include a gas flow rate for each gas species ($NH_3$, HF) of about 30-50 sccm, e.g., about 35-45 sccm, or about 40 sccm; a gas flow rate for the carrier gas (e.g., Ar) of about 30-40 sccm, e.g., about 35 sccm; a $NH_3$:HF flow rate (sccm) ratio of about 2:1 to about 1:2, e.g., about 1:1; a partial pressure (pp) of HF of about 5-10 mTorr, e.g., about 7 mTorr; an HF vapor temperature of about 20° C.-70° C., e.g., about 25° C.-45° C.; a gas pressure within the processing chamber 26 of about 10-30 mTorr, e.g., about 15-25 mTorr, or about 20 mTorr; a lid/wall chamber temperature of about 60° C.-80° C.; a stage (substrate) temperature of about 25° C.-45° C., e.g., about 40° C.; and a processing time of about 30 seconds to about 5 minutes, e.g., about 90-120 seconds. The COR process can thus be conducted to achieve a controlled reduction of relative small peaks 18$a$ (e.g., about 0.1-5 nm thick, or about 0.1-2 nm thick) including "whiskers" and other features that protrude from the surfaces of an oxide layer.

After performing the COR process, the substrate 10 is then heated to remove the reaction product $((NH_4)_2SiF_6)$ layer 40 that has formed, leaving the underlying unreacted oxide layer 14 exposed. In some embodiments, the substrate 10 is transported into a processing system 42 for performing a post-heat (thermal) treatment (PHT) to volatilize and remove the reaction product layer 40, as illustrated in FIG. 2B. In other embodiments, the substrate 10 can be transported into a substrate rinsing system, such as a water rinsing system (not shown).

In the illustrated prior art system, a PHT processing apparatus 42 can include a processing chamber 44, a mounting table 46 with a heating element 48 configured to heat the substrate 10 that has been subjected to a COR process, and a gas discharge outlet 50. A transfer system (not shown) can connect the COR processing system 24 and the PHT processing system 42 for transferring substrates between the treatment systems.

The substrate 10 is heated such that the byproduct $((NH_4)_2SiF_6)$ layer 40 is desorbed and thermally decomposed (e.g., volatilized). The substrate 10 (e.g., wafer) can be heated to a temperature of about 80° C.-200° C. (e.g., to about 150° C.), for a time period that generally ranges from about 60-180 seconds, and at a gas pressure of about 500 mTorr to about 1 Torr. Volatile gas components (e.g., $H_2O$, $NH_3$, $SiF_4$, HF, $N_2$, $H_2$) can be exhausted through the discharge outlet 50 by flowing an unreactive gas (e.g., $N_2$, etc.) through the chamber 44.

Figure 3B:
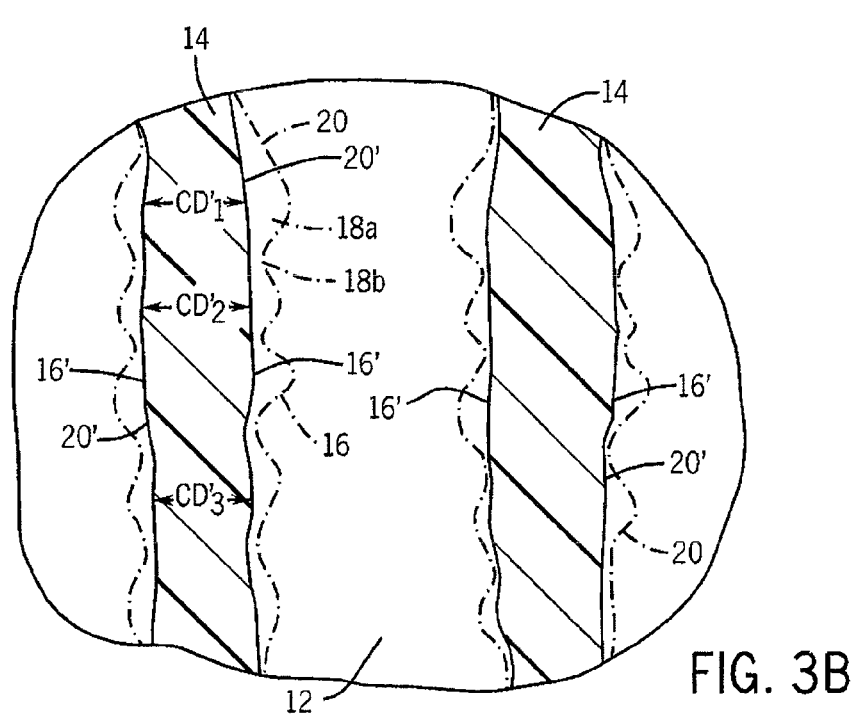

As shown in FIG. 3B, the heat treatment removes the byproduct $((NH_4)_2SiF_6)$ layer 40 to reduce or eliminate the peaks 18$a$ along sidewalls 20 of the spacers 14, resulting in smoothed edges (now, 16') and sidewalls (now 20'). According to embodiments of the invention, the COR treatment and material removal process are sequentially performed, and can be repeated to remove additional oxide material of peaks 18$a$ (e.g., whiskers, etc.) along the edges 16' and surfaces of the sidewalls 20' to further modify and shape the profile of the edges 16' of the spacers 14'. Optionally, after reducing LER of the spacers, new oxide material can be deposited to increase the width (CD) and modify the shape of the spacer, for example, using conventional ALD processing.

Embodiments of the invention can thus be used to reduce or eliminate line width roughness (LWR) and/or line edge roughness (LER) of oxide spacer hard masks by laterally planarizing the sidewalls of the spacers to reduce the peak-to-valley LWR amplitude to a desired edge profile for a more consistent critical dimension (CD) measurement along the length of the spacers, and to achieve smoother edges and sidewall surfaces. The methods can be used to produce mask spacers (lines) with more uniform and consistent widths along the length of the spacers to reduce critical dimension (CD) imbalance in both the mask spacers and in subsequently etched features.

Although specific embodiments have been illustrated and described herein, it will be appreciated by those of ordinary skill in the art that any arrangement that is calculated to achieve the same purpose may be substituted for the specific embodiments shown. This application is intended to cover any adaptations or variations that operate according to the principles of the invention as described. Therefore, it is intended that this invention be limited only by the claims and the equivalents thereof. The disclosures of patents, references and publications cited in the application are incorporated by reference herein.

What is claimed is:

1. A method of etching a material layer, comprising:
  forming a patterned temporary material having sidewalls and a horizontal surface over an underlying material;
  forming an oxide material onto the patterned temporary material;
  removing the oxide material from the horizontal surface of the patterned temporary material to form oxide spacers on the sidewalls of the patterned temporary material;
  removing the patterned temporary material to form vertical, free-standing and spaced-apart oxide spacers having a length, vertical surfaces with convex and concave portions, and an initial critical dimension that is variable along the length;
  exposing the vertical, free-standing and spaced-apart oxide spacers to an ammonium fluoride gas to convert the convex portions of the vertical surfaces of the vertical, free-standing and spaced-apart oxide spacers to a heat decomposable compound;
  removing at least a portion of the heat decomposable compound to obtain a uniform critical dimension along the length of the vertical, free-standing and spaced-apart oxide spacers; and
  removing the underlying material exposed within openings between the vertical, free-standing and spaced-apart oxide spacers.

2. The method of claim 1, wherein exposing the vertical, free-standing and spaced-apart oxide spacers to an ammonium fluoride gas comprises exposing the vertical, free-standing and spaced-apart oxide spacers to a mixture of ammonia and hydrogen fluoride.

3. The method of claim 1, wherein exposing the vertical, free-standing and spaced-apart oxide spacers to an ammonium fluoride gas comprises converting the convex portions of the vertical surfaces of the vertical, free-standing and spaced-apart oxide spacers to ammonium hexafluorosilicate $((NH_4)_2SiF_6)$.

4. The method of claim 3, wherein a greater thickness of the convex portions than the concave portions of the vertical surface of the vertical, free-standing and spaced-apart oxide spacer is converted to ammonium hexafluorosilicate $((NH_4)_2SiF_6)$ over a fixed period of time.

5. The method of claim 3, wherein removing at least a portion of the heat decomposable compound comprises applying heat, water or a combination thereof to the at least a portion of the heat decomposable compound.

6. The method of claim 1, wherein forming a patterned temporary material comprises forming the patterned temporary material comprising a photoresist material or amorphous carbon.

7. The method of claim 1, wherein depositing the oxide material onto the patterned temporary material comprises an atomic layer deposition or chemical vapor deposition.

8. The method of claim 1, wherein forming a patterned temporary material over an underlying material comprises forming the patterned temporary material over a material selected from the group consisting of a dielectric antireflective material, amorphous carbon, silicon nitride, polysilicon, crystalline silicon and metal.

9. The method of claim 1, wherein forming an oxide material comprises forming the oxide material selected from the group consisting of silicon oxide, ALD silicon oxide, tetraethylorthosilicate (TEOS) oxide, and silicon-rich silicon oxynitride (DARC).

10. A method of smoothing a vertical surface of an oxide material, the method comprising:
exposing an oxide material to an ammonium fluoride gas to convert convex portions of a vertical surface of the oxide material within an opening to a heat decomposable compound; and
removing at least a portion of the heat decomposable compound to smooth the vertical surface of the oxide material within the opening.

11. The method of claim 10, further comprising, after removing at least a portion of the heat decomposable compound, forming an oxide material onto a vertical surface of the opening.

12. The method of claim 11, wherein forming an oxide material onto a vertical surface of the opening comprises an atomic layer deposition or chemical vapor deposition.

13. The method of claim 10, wherein the opening is a linear opening having a length.

14. The method of claim 13, wherein removing at least a portion of the heat decomposable compound to smooth the vertical surface of the oxide material within the opening comprises reducing line edge roughness (LER) of the vertical surface of the oxide material to provide about the same critical dimension (CD) along the length of the linear opening.

15. The method of claim 14, wherein the linear opening has an initial critical dimension that is variable along the length, and, after the exposing and removing, the linear opening has about the same critical dimension for the length of the linear opening.

16. The method of claim 10, wherein the heat decomposable compound has a thickness of about 0.1 nm to 5 nm.

17. A method of smoothing a vertical surface of an oxide material, the method comprising:
exposing an oxide material to a mixture of ammonia and hydrogen fluoride to convert convex portions of a vertical surface of the oxide material within an opening in the oxide material to ammonium hexafluorosilicate $((NH_4)_2SiF_6)$; and
removing at least a portion of the ammonium hexafluorosilicate $((NH_4)_2SiF_6)$ to smooth the vertical surface of the oxide material within the opening.

18. The method of claim 17, wherein a greater thickness of the convex portions than the concave portions of the vertical surface of the oxide material is converted to ammonium hexafluorosilicate $((NH_4)_2SiF_6)$ over a fixed period of time.

19. The method of claim 17, wherein removing at least a portion of the ammonium hexafluorosilicate $((NH_4)_2SiF_6)$ comprises applying heat, water or a combination thereof to the at least a portion of the ammonium hexafluorosilicate $((NH_4)_2SiF_6)$.

20. The method of claim 17, wherein the vertical surface of the oxide material within the opening has an initial edge profile comprising convex and concave areas and an initial convex-to-concave area line width roughness (LWR) amplitude, and the initial convex-to-concave area LWR amplitude is reduced after the exposing and removing.

* * * * *